United States Patent
Kanaya et al.

(10) Patent No.: US 8,462,469 B1
(45) Date of Patent: Jun. 11, 2013

(54) MAGNETO-RESISTIVE EFFECT ELEMENT HAVING FEPT BIAS MAGNETIC FIELD APPLICATION LAYER WITH PT SEED LAYER AND MGO INSULATION LAYER

(75) Inventors: Takayasu Kanaya, Tokyo (JP); Masashi Sano, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/463,998

(22) Filed: May 4, 2012

(51) Int. Cl.
  *G11B 5/39* (2006.01)
(52) U.S. Cl.
  USPC .................................. 360/324.12
(58) Field of Classification Search
  USPC .............. 360/324.1, 324.11, 324.12, 324.2
  See application file for complete search history.

(56) References Cited

U.S. PATENT DOCUMENTS

| | | | | |
|---|---|---|---|---|
| 6,157,526 A * | 12/2000 | Watanabe et al. | ........ | 360/324.12 |
| 6,185,081 B1 * | 2/2001 | Simion et al. | ............ | 360/327.3 |
| 6,542,343 B1 * | 4/2003 | Gill | ........................... | 360/324.2 |
| 7,312,961 B2 * | 12/2007 | Kagami et al. | ............. | 360/324.2 |
| 8,169,753 B2 * | 5/2012 | Lin | .......................... | 360/324.12 |
| 8,208,230 B2 * | 6/2012 | Liu | .......................... | 360/324.12 |
| 8,213,131 B2 * | 7/2012 | Sun et al. | ................. | 360/324.12 |
| 8,240,026 B2 * | 8/2012 | Kagami et al. | ............ | 29/603.16 |
| 8,336,194 B2 * | 12/2012 | Yuan et al. | ................. | 29/603.14 |
| 2009/0274931 A1 | 11/2009 | Qiu et al. | | |
| 2010/0047627 A1 | 2/2010 | Yuan et al. | | |
| 2011/0007426 A1 * | 1/2011 | Qiu et al. | ....................... | 360/313 |
| 2011/0235216 A1 * | 9/2011 | Lin | ............................... | 360/324 |

* cited by examiner

*Primary Examiner* — Angel Castro
(74) *Attorney, Agent, or Firm* — Posz Law Group, PLC (57) ABSTRACT

A magneto-resistive effect (MR) element includes a magneto-resistive (MR) stack with a magnetization free layer, a bias magnetic field application layer positioned on a side of the MR stack, and an insulation film insulating the bias magnetic field application layer. The bias magnetic field application layer includes hard magnetic layer positioned on the side of the magnetization free layer and formed of iron-platinum (FePt) alloy and Pt seed layer provided between the MR stack and the hard magnetic layer and on a lower surface of the hard magnetic layer in contact manner with the hard magnetic layer and formed of platinum (Pt). The insulation film is a MgO insulation film formed of oxide magnesium (MgO), provided on a surface of the Pt seed layer in contact manner with the Pt seed layer, the surface being opposite to another surface of the Pt seed layer contacting the hard magnetic layer.

12 Claims, 10 Drawing Sheets

⊗ Magnetization Direction: from front side to back side of the sheet
⊙ Magnetization Direction: from back side to front side of the sheet

MAGNETO-RESISTIVE EFFECT ELEMENT HAVING FEPT BIAS MAGNETIC FIELD APPLICATION LAYER WITH PT SEED LAYER AND MGO INSULATION LAYER

BACKGROUND OF THE INVENTION

1. Field of the Invention

The present invention relates to a magneto-resistive effect (MR) element and particularly to a configuration of a bias magnetic field application layer.

2. Description of the Related Art

A MR element used for a hard disk drive (HDD) or the like has a magneto-resistive (MR) stack provided with a magnetization free layer and configured such that a sense current flows therethrough. The magnetization free layer is a magnetic layer of which a magnetization direction changes according to an external magnetic field. The MR stack further has a magnetization pinned layer of which a magnetization direction is pinned, and a spacer layer positioned between the magnetization pinned layer and the magnetization free layer. These three layers change electrical resistance of a sense current based on a MR effect. In another case, the MR stack may have two magnetization free layers and a spacer layer positioned between these magnetization free layers. Also in this case, three layers—the two magnetization free layers and the spacer layer—change electrical resistance of a sense current based on the MR effect. The MR stack reads magnetic data recorded on a magnetic recording medium from the electrical resistance change.

Even with either of the configurations, in order to obtain a large MR change, the magnetization free layer preferably forms a single magnetic domain in a state where no external magnetic field is applied. Accordingly, bias magnetic field application layers are provided on sides of the MR stack, specifically sides of the magnetization free layer, to let the magnetization free layer form a single magnetic domain. The bias magnetic field application layers are mainly configured with hard magnetic layers, and apply a bias magnetic field toward the sides of the MR stack in a direction perpendicular to a lamination direction of the MR stack.

In conjunction with an increase in a recording density of a HDD, it is required for a hard magnetic layer to have a high saturation magnetization (Bs) and high coercive force (Hc). A high saturation magnetization helps to intensify a bias magnetic field and to stabilize a magnetization direction of a magnetization free layer that is narrowed due to the narrowing of tracks. High coercive force enhances the magnetization stability of the hard magnetic layer. Specifically, even when, due to the narrowing of the lead gap, effects of magnetic function from upper and lower shield layers increase, a magnetic tolerance of the hard magnetic layer is enhanced. When, a flying height of a magnetic head slider is reduced for the increase in the recording density of a HDD, a contact tolerance with a magnetic recording medium is enhanced.

Using a FePt alloy for the hard magnetic layer has been known for enhancing the coercive force and the saturation magnetization of the hard magnetic layer. A high temperature annealing is normally necessary to regularize the FePt alloy. However, performing the high temperature annealing causes dispersion of magnetization directions of other ferromagnetic layers, for example, the magnetization pinned layer of the MR stack. Therefore, it is preferable to cause the regularization with an even lower temperature. U.S. Application Publication No. 2009/0274931 and U.S. Application Publication No. 2010/0047627A1 disclose a configuration of such bias magnetic field application layer. The bias magnetic field application layer is provided with a seed layer and a cap layer, and an intermediate alloy layer (hard magnetic layer) positioned between the seed layer and the cap layer. The seed layer and the cap layer can be formed of Pt. The intermediate alloy layer is formed with a plurality of FePt layers, and the FePt layers adjacent to each other have different compositions.

Because Pt is conductive, a direct contact of the seed layer made of Pt with the MR stack may cause a bypass path for a sense current that connects the MR stack with the hard magnetic layer via the seed layer. Similarly, a direct contact of the seed layer made of Pt with a lower shield layer may allow a sense current to flow from an upper shield layer to the lower shield layer through the hard magnetic layer. These phenomena interfere with a sense current focusing on the MR stack. Accordingly, an insulation film is formed between the hard magnetic layer and the MR stack and between the hard magnetic layer and the lower shield layer. Upon a manufacturing process, the seed layer is formed not only under the hard magnetic layer but also on the side of the MR stack. Due to this, the bias magnetic field application layer is insulated from the MR stack and the lower shield layer, and a sense current flows focusing on the MR stack. $Al_2O_3$ is normally used for the insulation film.

However, Al and Pt are more likely to mix with each other and Pt diffuses into $Al_2O_3$, and thereby the insulativity of $Al_2O_3$ may decrease or lose. In that case, a sense current partially flows to the bias magnetic field application layer, and a sense current may be inhibited from focusing on the MR stack. Forming a diffusion prevention layer between the insulation film and the seed layer allows to prevent Pt from diffusing into $Al_2O_3$; however, because the diffusion prevention layer is formed on the side of the MR stack, a distance between the MR stack (especially the magnetization free layer) and the bias magnetic field application layer increases, and the intensity of a bias magnetic field applied from the bias magnetic field application layer to the magnetization free layer decreases.

An objective of the present invention is to provide a MR element which can be annealed with a low temperature and with which a focusing of a sense current on the MR stack is easy.

SUMMARY OF THE INVENTION

A magneto-resistive effect (MR) element of the present invention includes a magneto-resistive (MR) stack that is provided with a magnetization free layer of which a magnetization direction changes according to an external magnetic field and that detects a change of the external magnetic field as an electrical resistance change based on a MR effect of a sense current that flows through the MR stack, a bias magnetic field application layer that is positioned on a side of the MR stack, which excludes an air bearing surface, with respect to a lamination direction, and an insulation film that insulates the bias magnetic field application layer. The bias magnetic field application layer includes a hard magnetic layer that is positioned on the side of the magnetization free layer and that is formed of an iron-platinum (FePt) alloy, and a Pt seed layer that is provided between the MR stack and the hard magnetic layer and on a lower surface of the hard magnetic layer with respect to the lamination direction, and in a contact manner with the hard magnetic layer, and that is formed of platinum (Pt). The insulation film is a MgO insulation film that is formed of oxide magnesium (MgO), that is provided on a surface of the Pt seed layer in a contact manner with the Pt seed layer, the surface being opposite to another surface of the Pt seed layer contacting the hard magnetic layer.

By providing the Pt seed layer that is made of an iron-platinum (FePt) alloy on a surface of the Pt seed layer opposite to a surface of the Pt seed layer contacting the hard magnetic layer and in a contact manner with the hard magnetic layer, regularization of the hard magnetic layer can be promoted with a low temperature. Because magnesium (Mg), which configures the MgO insulation film, has higher alloying energy with Pt as compared to Al, Pt is prevented from diffusing into the MgO insulation film. As a result, a decrease in the insulativity of the MgO insulation film is prevented, and a sense current becomes more likely to focus on the MR stack.

The above description, as well as other objects, features, and advantages of the present specification will be evident by the detailed description that follows below with reference to attached drawings exemplifying the present specification.

DETAILED DESCRIPTION OF THE INVENTION

Descriptions will be given of embodiments of the present invention with reference to the drawings.

First Embodiment

Figure 1:
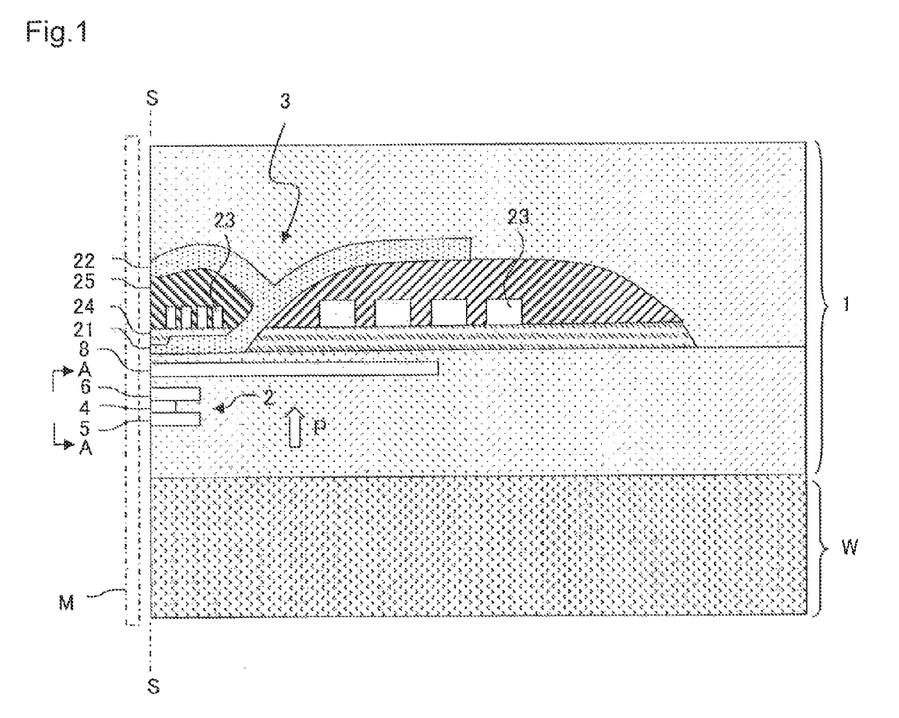
FIG. 1 is a main part cross-sectional view of a thin film magnetic head according to a first embodiment.
Figure 2:
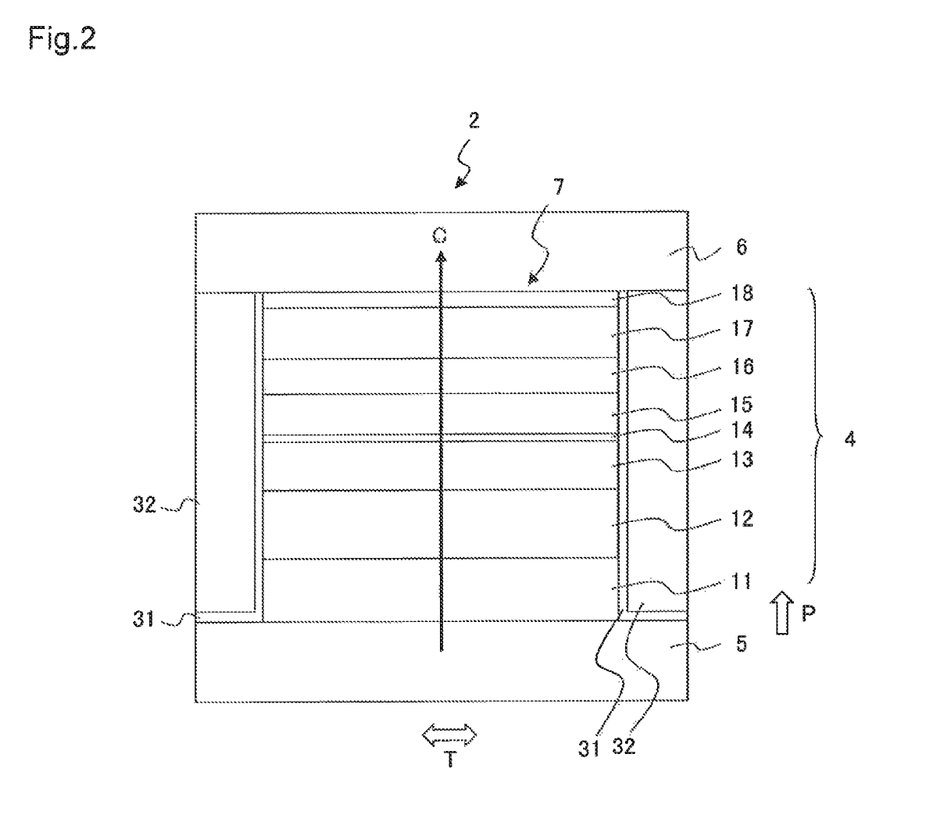
FIG. 2 is a side view of a MR element from a perspective of an A-A direction of FIG. 1, i.e., an air bearing surface.

FIG. 1 illustrates a main part cross-sectional view of a thin film magnetic head 1 according to a first embodiment. The thin film magnetic head 1 is formed on a substrate W and has a reader element 2 and a recording element 3. FIG. 2 is a side view of the reader element 2 from a perspective of an A-A direction of FIG. 1 and illustrates a layer configuration of the reader element 2 on an air bearing surface S. The air bearing surface S is a surface of the thin film magnetic head 1 that faces a recording medium M. First, a description is given of a configuration of the reader element 2 with reference to FIG. 2.

The reader element 2 has a MR element 4 of a spin valve type, and upper and lower shield layers 6 and 5 that are provided so as to sandwich the MR element 4 in a lamination direction P thereof. The lamination direction P is a direction orthogonal to the MR element 4, specifically film surfaces of a magneto-resistive (MR) stack 7, and orientating from the substrate W toward the thin film magnetic head 1. The MR element 4 has the MR stack 7 through which a sense current C flows, and bias magnetic field application layers 32 provided on both sides of the MR stack 7 with respect to a track width direction T (sheet surface orthogonal direction in FIG. 1). A front end part of the MR element 4, as illustrated in FIG. 1, is arranged on the air bearing surface S. The MR stack 7 is configured to flow a sense current C in the lamination direction or a direction opposite thereto by a voltage applied between the upper shield layer 6 and the lower shield layer 5. The intensity of a magnetic field from the recording medium M positioned facing the MR stack 7 changes as the recording medium M rotates. A magnetic field change is detected as an electrical resistance change of a sense current C based on the magneto-resistive effect. The MR stack 7 reads magnetic data written in the recording medium M utilizing this principle.

Table 1 indicates one example of a layer configuration of the MR stack 7. Table 1 describes the lower shield layer 5 through the upper shield layer 6 from bottom to up in the lamination order.

TABLE 1

| Layer Configuration | | Material | Film Thickness (nm) |
|---|---|---|---|
| Upper Shield Layer 6 | | NiFe | 2000 |
| MR Stack 7 | Protective Layer 18 | Ru | 10.0 |
| | Magnetization Free Layer 17 | CoFe | 4.0 |
| | Spacer Layer 16 | Cu | 0.7 |
| | Inner Magnetization Pinned Layer 15 | CoFe | 3.5 |
| | Exchange-Coupling Transmission Layer 14 | Ru | 0.8 |
| | Outer Magnetization Pinned Layer 13 | CoFe | 3.0 |
| | Antiferromagnetic Layer 12 | IrMn | 5.0 |
| | Seed Layer 11 | Ru | 2.0 |
| | | Ta | 1.0 |
| Lower Shield Layer 5 | | NiFe | 2000 |

The MR stack 7 has a layer configuration in which the followings are laminated above the lower shield layer 5 formed with an NiFe layer in this order: a seed layer 11, an antiferromagnetic layer 12, an outer magnetization pinned layer 13, an exchange-coupling transmission layer 14, an inner magnetization pinned layer 15, a spacer layer 16, a magnetization free layer 17, and a protective layer 18. The protective layer 18 is covered by the upper shield layer 6 made with a NiFe layer.

The seed layer 11 is formed with a lamination film of Ta and Ru and is provided to obtain a favorable exchange-coupling between the antiferromagnetic layer 12 and the outer magnetization pinned layer 13 that are laminated above the seed layer 11. The seed layer 11 can be also formed with a lamination film of Ta and NiCr using NiCr as an alternative for Ru. The outer magnetization pinned layer 13 is exchange-coupled with the antiferromagnetic layer 12 made of IrMn. The outer magnetization pinned layer 13 is exchange-coupled with the inner magnetization pinned layer 15 through the exchange-coupling transmission layer 14 therebetween, the exchange-coupling transmission layer 14 being made of Ru. As a result, the magnetization direction of the inner magnetization pinned layer 15 is firmly pinned. It is desirable that the inner magnetization pinned layer 15 is magnetized in a direction orthogonal to the air bearing surface S within a film plane thereof. Because the magnetization directions of the inner magnetization pinned layer 15 and the outer magnetization pinned layer 13 are pinned in mutually antiparallel orientations, the overall magnetization of a portion in which these are combined is suppressed. The magnetization free layer 17 of which the magnetization direction changes according to an external magnetic field is provided above the inner magnetization pinned layer 15, and the magnetization free layer 17 and the inner magnetization pinned layer 15 sandwich the spacer layer 16. The spacer layer 16 is made of an arbitrary material that causes magneto-resistive effect such as Cu, Zn, GaOx, MgO, or the like. The protective layer 18 is provided to prevent the deterioration of the laminated layers. The magnetization free layer 17 as well as the outer and inner magnetization pinned layers 13 and 15 are typically made of CoFe; however, may include Ni.

The bias magnetic field application layers 32 are formed on both sides of the MR stack 7 with respect to the track width direction T, and the insulation films 31 are formed therebetween. The bias magnetic field application layers 32 are magnetic domain control films that form a single magnetic domain in the magnetization free layer 17, and apply a bias magnetic field in the track width direction T to the magnetization free layer 17. The bias magnetic field application layer 32 may also be provided on only one side of the MR stack 7 with respect to the track width direction T. In other words, considering a second embodiment, which will be described below, the bias magnetic field application layer needs to be positioned only on either one of the lateral sides of the MR stack with respect to the lamination direction except for the side of the air bearing surface. Detail descriptions of the bias magnetic field application layers 32 will be given later.

A sense current C flows in the MR stack 7 in the lamination direction P (or a direction opposite thereto). A sense current C is supplied from the upper and lower shield layers 6 and 5 which also function as electrodes. The magnetization direction of the magnetization free layer 17 is controlled to be in the track width direction T, i.e., in the direction orthogonal to the magnetization direction of the inner magnetization pinned layer 15, by the bias magnetic field from the bias magnetic field application layers 32 in a state where an external magnetic field is not applied. When an external magnetic field from the recording medium M is applied to the magnetization free layer 17, the magnetization direction of the magnetization free layer 17 rotates by a predefined angle to a predetermined direction within the film plane according to the direction and intensity of the external magnetic field. The magnetization direction of the magnetization free layer 17 forms a relative angle to the magnetization direction of the inner magnetization pinned layer 15 according to the direction and intensity of the external magnetic field, and the spin dependent scattering of conductive electrons changes according to the relative angle, and thereby a magneto-resistive change is generated. The MR stack 7 detects the magneto-resistive change, and reads magnetic data of the recording medium M.

Figure 3:
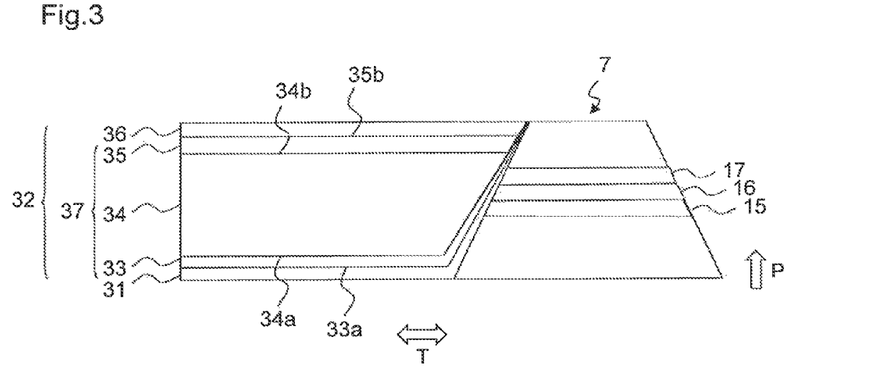
FIG. 3 is a schematic cross-sectional view of a bias magnetic field application layer.

FIG. 3 is a schematic cross-sectional view of the bias magnetic field application layer. The figure illustrates only the bias magnetic field application layer on one side with respect to the track width direction of the MR stack 7; however, the bias magnetic field application layer on the other side has the same configuration.

The bias magnetic field application layer 32 is configured with a Pt seed layer 33 formed of platinum (Pt), a hard magnetic layer 34 formed of an iron platinum alloy (FePt), a Pt cap layer 35 formed of platinum (Pt), and an upper cap layer 36 formed of one or more of ruthenium (Ru), rhodium (Rh), palladium (Pd), osmium (Os), and iridium (Ir). These layers 32-36 may include a slight amount of additives and/or impurities (1% atomic fraction or less in total).

The hard magnetic layer 34 is positioned on at least a side of the magnetization free layer 17 with respect to the track width direction T to apply a bias magnetic field to the magnetization free layer 17. Iron (Fe) mainly functions to realize a high saturation magnetization of the hard magnetic layer 34, and platinum (Pt) mainly functions to increase coercive force of the hard magnetic layer 34.

The Pt seed layer 33 is provided between the MR stack 7 and the hard magnetic layer 34 and on a lower surface 34a of the hard magnetic layer 34 with respect to the lamination direction P, and in a contact manner with the hard magnetic layer 34. A film thickness of the Pt seed layer 33 varies depending on a position thereof; however, the film thickness is desirably in a range between 0.5 nm (inclusive) and 5 nm (inclusive). In order that a FePt alloy has sufficient coercive force, the FePt alloy is desirably regularized. In a regularized state, the FePt alloy can have a face-centered cubic lattice (fcc) structure. Because Pt is less likely to be regularized by heat, the FePt alloy normally needs a high temperature annealing. However, in order to prevent an effect on other magnetic layers of the MR stack 7 such as, for example, the magnetization pinned layers 13 and 15, an annealing temperature is desirably 250° C. or less. The Pt seed layer 33 has an effect that promotes regularization of the FePt alloy, and gives sufficient coercive force to the hard magnetic layer 34 at an annealing temperature of approximately 250° C.

The Pt cap layer 35 is provided on an upper surface 34b of the hard magnetic layer 34 with respect to the lamination direction P and in a contact manner with the hard magnetic layer 34. A film thickness of the Pt cap layer 35 is desirably between 0.5 nm (inclusive) and 10 nm (inclusive). The Pt cap layer 35 as well as the Pt seed layer 33 promotes regularization of the FePt alloy, and gives sufficient coercive force to the hard magnetic layer 34 at an annealing temperature of approximately 250° C.

In order to increase a saturation magnetization and make the regularization easier, a FePt content percentage of the hard magnetic layer 34 is Fe-rich, in other words, an atomic fraction of Fe is higher than that of Pt. However, because the Fe-rich component lacks Pt, which is needed for the regularization, the Pt seed layer 33 and the Pt cap layer 35 that don't have the function as the hard magnetic layer 34 are provided, and Pt is supplied from these layers 33 and 35 during annealing. As a result, it becomes possible to obtain both the high saturation magnetization and the high coercive force. As will be described later, an atomic fraction of platinum (Pt) of a region 37 formed by combining the hard magnetic layer 34, the Pt seed layer 33 and the Pt cap layer 35 is desirably between 32% (inclusive) and 43% (inclusive).

The upper cap layer 36 is provided on the upper surface 35b of the Pt cap layer 35 with respect to the lamination direction P and in a contact manner with the Pt cap layer 35. Pt of the Pt cap layer 35 tends, during annealing, to diffuse into not only the hard magnetic layer 34 but also the upper shield layer 6. Accordingly, the upper cap layer 36 has a function as a diffusion prevention layer that prevents Pt from diffusing into the upper shield layer 6. The upper cap layer 36 is preferably formed of a Pt family element other than Pt, and specifically, is desirably formed of the above-described elements.

The insulation film 31 is a MgO insulation film formed of magnesium oxide (MgO), and is provided between the MR stack 7 and the Pt seed layer 33 and on a lower surface 33a of the Pt seed layer 33 with respect to the lamination direction P. A film thickness of the MgO insulation film 31 varies depending on a position thereof; however, the film thickness is desirably in a range between 1 nm (inclusive) and 10 nm (inclusive). The insulation film 31 functions as an insulation film between the Pt seed layer 33 and the MR stack 7 and between the Pt seed layer 33 and the lower shield layer 5.

Normally, $Al_2O_3$ is used for an insulation film between the bias magnetic field application layer and the MR stack; however, Al has small alloying energy with Pt, and easily diffuses into $Al_2O_3$. In such case, an insulativity of $Al_2O_3$ decreases or loses, and a decrease in an element resistance of the MR stack and a decrease in an output value, which is accompanied by the decrease in the element resistance, are caused. In the present embodiment, because MgO, which has large alloying energy, is used as a material of the insulation film 31, an insulativity of the insulation film 31 is secured.

As described above, the insulation film 31 is provided also under the lower surface 33a of the Pt seed layer 33 with respect to the lamination direction P. Therefore, the insulation film 31 is provided also between the Pt seed layer 33 and the lower shield layer 5. As a result, a bypass path for a sense current that connects the upper and lower shield layers 6 and 5 via the bias magnetic field application layer 32 without passing through the MR stack 7 is prevented from being formed.

Another insulation film may be provided at least either between the insulation film 31 and the MR stack 7 or between the insulation film 31 and the lower shield layer 5.

The MgO insulation film 31 has an effect that prevents diffusion of Pt; however, in a case when an annealing temperature is low, diffusion of Pt itself is suppressed, so that a conventional $Al_2O_3$ insulation film may be used. In such case, in order to promote the regularization of the hard magnetic layer 34 at a low temperature, as described above, the atomic fraction of platinum (Pt) of the region 37 formed by combining the hard magnetic layer 34, the Pt seed layer 33 and the Pt cap layer 35 is further desirably between 32% (inclusive) and 43% (inclusive). As described above, setting the atomic fraction of Pt in the above-described range (between 32% (inclusive) and 43% (inclusive)) and using the MgO insulation film 31 can be combined, and also only either one of them can be adopted.

Figure 4:
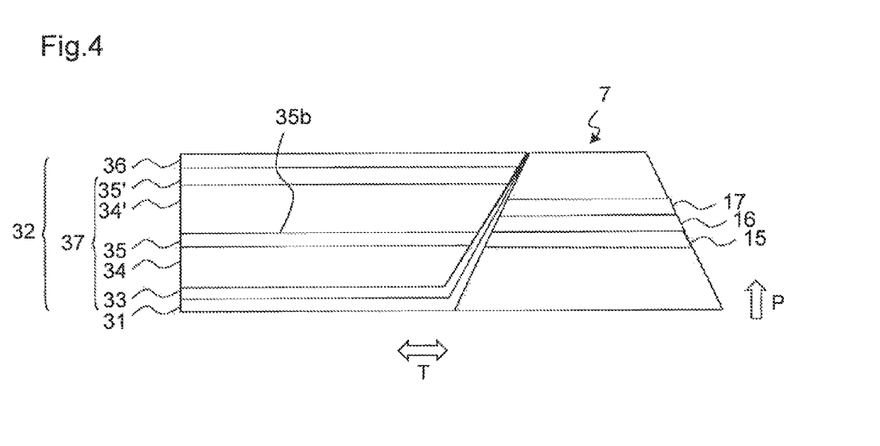
FIG. 4 is a schematic cross-sectional view of a bias magnetic field application layer according to a modified example.

In the present embodiment, a single pair of the hard magnetic layer 34 and the Pt cap layer 35 is provided; however, it is also possible to provide a plurality of pairs of the hard magnetic layers 34 and the Pt cap layers 35. In an embodiment illustrated in FIG. 4, a second hard magnetic layer 34' formed of an iron-platinum (FePt) alloy and a second Pt cap layer 35' formed of platinum (Pt) are formed on the upper surface 35b of the Pt cap layer 35 so as to contact the second hard magnetic layer 34' with the Pt cap layer 35. In other words, the hard magnetic layers and the Pt cap layers—herein, the number of the hard magnetic layers and the number of the Pt cap layers are the same—may be laminated in an order of the hard magnetic layer, the Pt cap layer, the hard magnetic layer, the Pt cap layer . . . in the lamination direction P by arbitrary times. With such a multilayer structure, a film thickness of each hard magnetic layer is thinned, and thereby Pt can be efficiently supplied from the periphery of each hard magnetic layer. As a result, while a film configuration of each hard magnetic layer is configured to be Fe-rich, the regularization of each hard magnetic layer can be realized at a low temperature.

With reference to FIG. 1 again, the recording element 3 is provided above the reader element 2, and an interelement shield layer 8 is formed therebetween by a sputtering method or the like. The recording element 3 has a configuration for so-called perpendicular magnetic recording. A magnetic pole layer for writing is formed with a main magnetic pole layer 21 and an auxiliary magnetic pole layer 22. These magnetic pole layers are formed by a frame plating method or the like. The main magnetic pole layer 21 is formed of FeCo and is arranged in an orientation nearly orthogonal to the air bearing surface S on the air bearing surface S. A coil layer 23 extending over a gap layer 24 made of an insulating material is wound around the periphery of the main magnetic pole layer 21 so that a magnetic flux is induced to the main magnetic pole layer 21 by the coil layer 23. The coil layer 23 is formed by a frame plating method or the like. The magnetic flux is guided within the main magnetic pole layer 21 and is emitted from the air bearing surface S towards the recording medium M. The main magnetic pole layer 21 is tapered not only in the lamination direction P but also in the track width direction T near the air bearing surface S to generate a minute and intense write magnetic field in correspondence with the high recording density.

The auxiliary magnetic pole layer 22 is a magnetic layer magnetically coupled with the main magnetic pole layer 21. The auxiliary magnetic pole layer 22 is a magnetic pole layer with a film thickness of approximately 0.01 μm-approximately 0.5 μm, and is formed of an alloy composed of two or three of Ni, Fe, Co or the like. The auxiliary magnetic pole layer 22 is provided in a manner of branching from the main magnetic pole layer 21 and faces the main magnetic pole layer 21 through the gap layer 24 and a coil insulation film 25 therebetween on the air bearing surface S side. An end part of the auxiliary magnetic pole layer 22 on the air bearing surface S side forms a trailing shield part in which a layer cross-section is wider than other parts of the auxiliary magnetic pole layer 22. A magnetic field gradient between the auxiliary magnetic pole layer 22 and the main magnetic pole layer 21 becomes steeper in the vicinity of the air bearing surface S by providing this type of auxiliary magnetic pole layer 22. As a result, a jitter of a signal output value is reduced, and an error rate during reading can be lowered.

Second Embodiment

Figure 5:
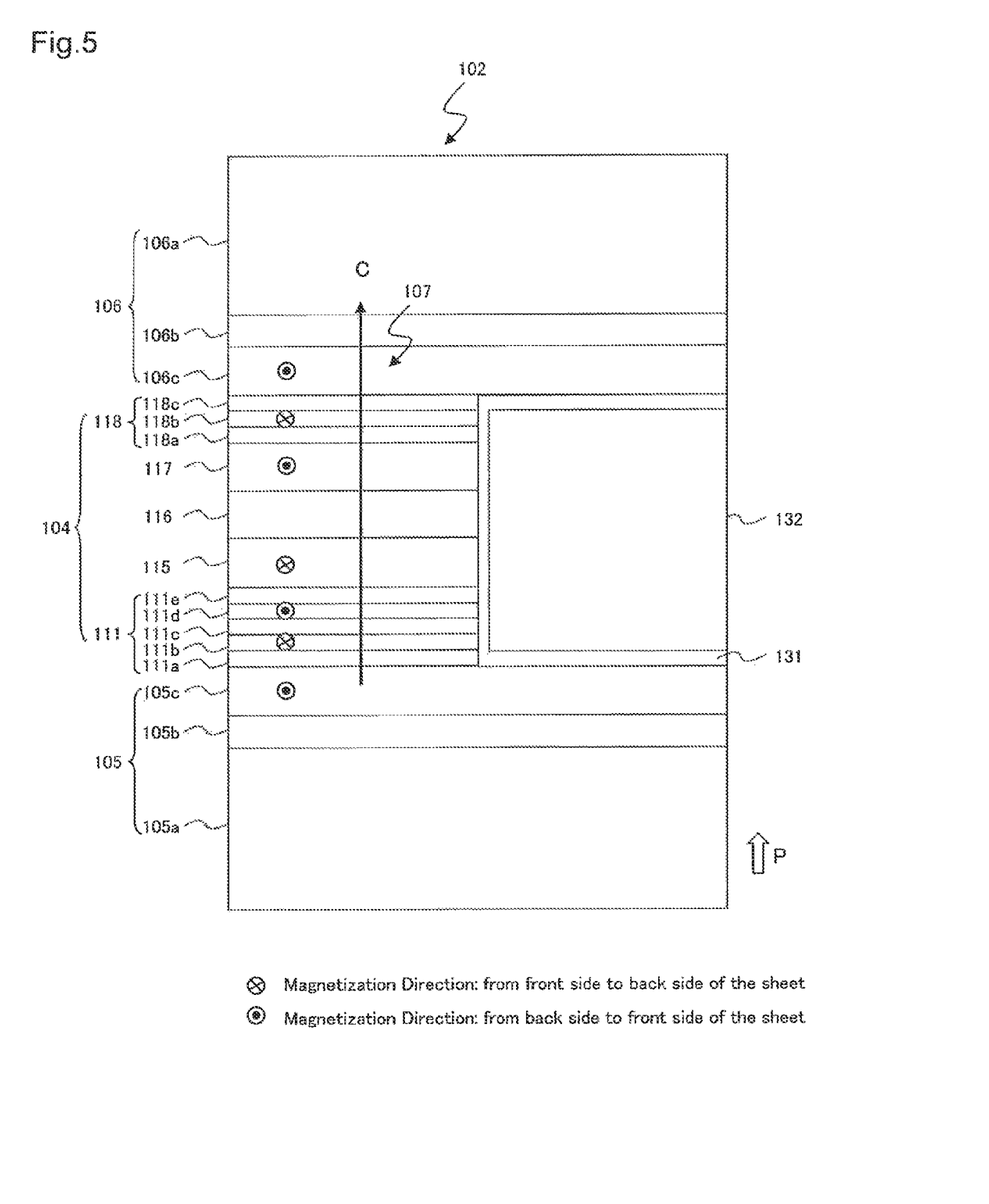
FIG. 5 is a cross-sectional view of a MR element according to a second embodiment from a perspective of the same direction as FIG. 1.

The thin film magnetic head 1 of the present embodiment is the same as the first embodiment illustrated in FIG. 1 with the exception of a configuration of a reader element 102. FIG. 5 is a side view of the reader element 102 and illustrates a layer configuration of the reader element 102 on the air bearing surface S. Table 2 indicates one example of a layer configuration of a MR stack 107. The reader element 102 has a MR element 104 in which a large number of layers are laminated in the same manner as the first embodiment, and upper and lower shield layers 106 and 105 that are provided so as to sandwich the MR element 104 in the lamination direction P. The MR element 104 has the MR stack 107 through which a sense current C flows, and a bias magnetic field application layer 132 provided on the backside of the MR stack 107 as seen from the air bearing surface S. The upper and lower shield layers 106 and 105 are also used as electrodes for a sense current C so that a sense current C flows in the lamination direction P (or a direction opposite thereto) of the MR stack 107.

According to the present embodiment, two magnetization free layers 115 and 117 in both of which a magnetization direction changes according to an external magnetic field are provided. The bias magnetic field application layer 132 is provided on a backside of the MR element 104 from a perspective of the air bearing surface S with an insulation film 131 therebetween, and applies a bias magnetic field to the first and second magnetization free layers 115 and 117 in a direction orthogonal to the air bearing surface S. A spacer layer 116 is provided between the first and second magnetization free layers 115 and 117. A first magnetic linkage layer 111 is provided between the first magnetization free layer 115 and the lower shield layer 105, and a second magnetic linkage layer 118 is provided between the second magnetization free layer 117 and the upper shield layer 106.

TABLE 2

| | Film Configuration | | Material | Film Thickness (nm) |
|---|---|---|---|---|
| Upper Shield Layer 106 | Second Main Shield Layer 106a | | NiFe | 2000 |
| | Second Antiferromagnetic Layer 106b | | IrMn | 6.0 |
| | Second Exchange-Coupling Magnetic Field Application Layer 106c | | CoFe | 1.5 |
| | | | NiFe | 20.0 |
| MR Stack 107 | Second Magnetic Linkage Layer 118 | Exchange Coupling Transmission Layer 118c | Ru | 0.8 |
| | | Gap Adjustment Layer 118b | CoFe | 6.0 |
| | | Exchange-Coupling Transmission Layer 118a | Ru | 0.8 |
| | Second Magnetization Free Layer 117 | | CoFe | 4.0 |
| | Spacer Layer 116 | Second Nonmagnetic Layer 116c | Cu | 0.4 |
| | First Magnetization Free Layer 115 | | CoFe | 4.0 |
| | First Magnetic Linkage Layer 111 | Exchange-Coupling Transmission Layer 111e | Ru | 0.8 |
| | | Gap Adjustment Layer 111d | CoFe | 6.0 |
| | | Exchange-Coupling Transmission Layer 111c | Ru | 0.8 |
| | | Gap Adjustment Layer 111b | CoFe | 1.0 |
| | | Exchange-Coupling Transmission Layer 111a | Ru | 0.8 |
| Lower Shield Layer 105 | First Exchange-Coupling Magnetic Field Application Layer 105c | | NiFe | 20.0 |
| | | | CoFe | 1.5 |
| | First Antiferromagnetic Layer 105b | | IrMn | 6.0 |
| | First Main Shield Layer 105a | | NiFe | 2000 |

The lower shield layer 105 has a first main shield layer 105a, and a first antiferromagnetic layer 105b and a first exchange-coupling magnetic field application layer 105c that are laminated above the first main shield layer 105a. The magnetization direction of the first exchange-coupling magnetic field application layer 105c is pinned in the track width direction T (sheet orthogonal direction) due to an antiferromagnetic coupling with the first antiferromagnetic layer 105b. Similarly, the upper shield layer 106 has a second main shield layer 106a, and a second antiferromagnetic layer 106b and a second exchange-coupling magnetic field application layer 106c that are laminated below the second main shield layer 106a. The magnetization direction of the second exchange-coupling magnetic field application layer 106c is pinned in the track width direction T due to an antiferromagnetic coupling with the second antiferromagnetic layer 106b. The first and second exchange-coupling magnetic field application layers 105c and 106c are magnetized mutually in the same direction. In other embodiments, instead of providing the first and second antiferromagnetic layers 105b and 106b and the first and second exchange-coupling magnetic field application layers 105c and 106c, the magnetization directions of the first and second main shield layers 105a and 106a may be oriented in the same direction by forming the first and second main shield layers 105a and 106a in a long and narrow shape in the track width direction T and forming a single magnetic domain using a shape anisotropic effect.

The first magnetic linkage layer 111 has a configuration in which gap adjustment layers 111b and 111d composed of CoFe are alternately and respectively laminated with exchange-coupling transmission layers 111a, 111c and 111e composed of Ru, and the exchange-coupling transmission layers 111a and 111e are positioned at both side end surfaces. The second magnetic linkage layer 118, in the same manner as the first magnetic linkage layer 111, also has a configuration in which a gap adjustment layer 118b composed of CoFe is alternately laminated with exchange-coupling transmission layers 118a and 118c composed of Ru, and the exchange-coupling transmission layers 118a and 118c are positioned at both side end surfaces. A pair of magnetic layers 105c and 111b, a pair of magnetic layers 111b and 111d, and a pair of magnetic layers 111d and 115 that respectively sandwich the exchange-coupling transmission layers 111a, 111c, and 111e perform exchange-coupling. A pair of magnetic layers 106c and 118b and a pair of magnetic layers 118b and 117 that respectively sandwich the exchange-coupling transmission layers 118c and 118a perform exchange-coupling. As illustrated in FIG. 5, the magnetization directions alternately reverse (no bias magnetic field is applied).

The total film thickness of the MR element 104 can be adjusted to match the shield gap by adjusting the film thicknesses of the gap adjustment layers 111b, 111d and 118b. The smaller the shield gap is, the more beneficial it is to realize high recording density; however, the shield gap may also be determined by a required film thickness of the bias magnetic field application layer 132. In this case, it is preferred to adjust the total film thickness, i.e., the shield gap, of the MR element 104 by changing the film thicknesses of the gap adjustment layers 111b, 111d and 118b.

Figure 6:
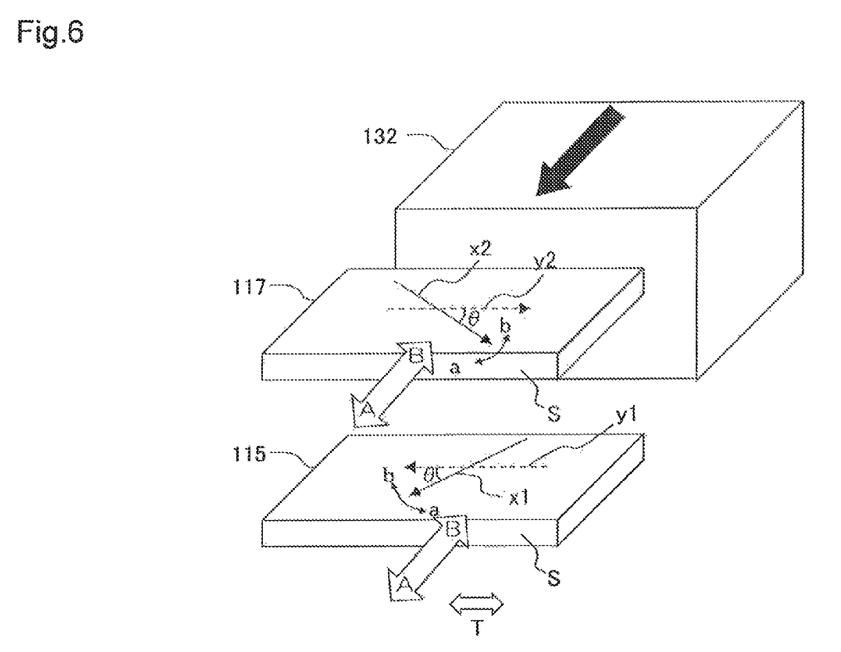
FIG. 6 is a schematic view illustrating a principle of performance of a thin film magnetic head according to the second embodiment.

The above-described MR element 104 performs as described hereinafter. A virtual condition will be considered first in which there is no bias magnetic field application layer 132. FIG. 6 is a schematic view illustrating the magnetizations of the first and second magnetization free layers 115 and 117. The magnetization directions of the first and second exchange-coupling magnetic field application layers 105c and 106c transmit to the first and second magnetization free layers 115 and 117 while reversing at the gap adjustment layers 111b, 111d and 118b through the exchange-coupling transmission layers 111a, 111c, 111e, 118a and 118c therebetween. Therefore, the first magnetization free layer 115 is magnetized in the track width direction T toward an orientation y1 that is antiparallel to the magnetization direction of the first exchange-coupling magnetic field application layer 105c. The second magnetization free layer 117 is magnetized in the track width direction T toward an orientation y2 that is the same as the magnetization direction of the second exchange-coupling magnetic field application layer 106c.

Next, a condition is considered in which a bias magnetic field is applied. The bias magnetic field rotates the magnetization directions of the first and second magnetization free layers 115 and 117, the directions being oriented in the track width direction T, toward a direction orthogonal to the air bearing surface S. As illustrated by the solid line arrows x1 and x2 of FIG. 6, the magnetization directions rotate by the prescribed angle θ in mutually opposite directions from the broken line arrows y1 and y2, and ideally are mutually orthogonal. This is the magnetization state of the first and second magnetization free layers 115 and 117 when no external magnetic field is applied.

When an external magnetic field is applied in this state as illustrated by the outline arrows in the drawing, the magnetization directions of the first and second magnetization free layers 115 and 117 rotate in mutually opposite directions according to the orientation of the external magnetic field. When the external magnetic field is applied in the direction A in the drawing, the magnetization directions (solid line arrows x1 and x2) of the first and second magnetization free layers 115 and 117 rotate in the direction (a) in the drawing, and when the external magnetic field is applied in the direction B in the drawing, the magnetization directions of the first and second magnetization free layers 115 and 117 rotate in the direction (b) in the drawing. In this manner, a relative angle formed by the magnetization directions of the first and second magnetization free layers 115 and 117 changes according to the external magnetic field, and the resistance value for the sense current C varies based on the magnetoresistive effect. Utilizing this principle, the MR element 107 can detect the orientation and intensity of the external magnetic field.

Example

Four types of bias magnetic field application layers, each of the types having a different configuration, were arranged on both sides of the MR stacks with respect to the track width direction, and reader elements were configured. An element characteristic and a tolerance with respect to an external magnetic field of the reader elements were evaluated. A process for forming the reader elements used in the present example is indicated in FIGS. 7A-7D. Figures on the right side are plan views, and figures on the left side are cross-sectional views cut along respectively the line A-A through the line D-D illustrated in the plan views.

Figure 7A:
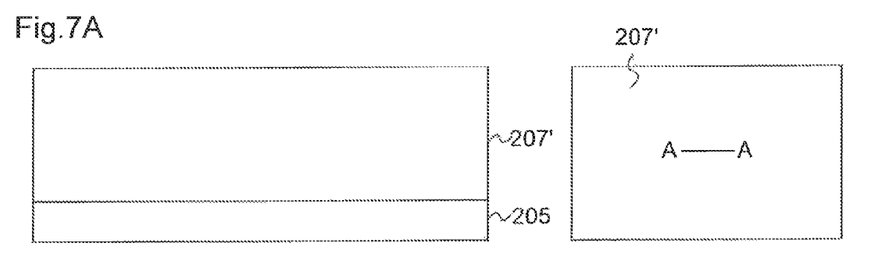
FIGS. 7A-7D are schematic views illustrating a process for forming a reader element according to an example.
Figure 7B:
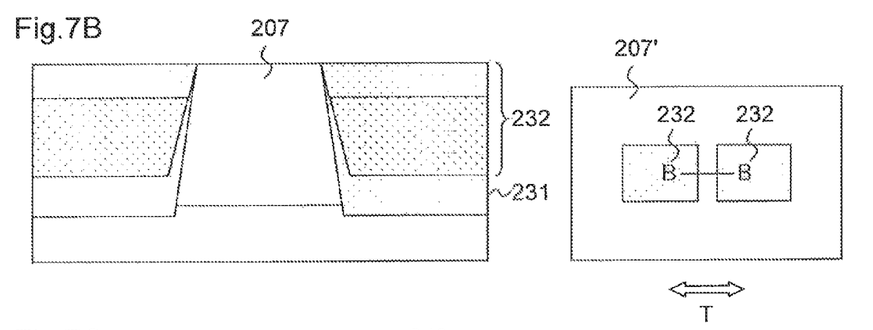
Figure 7C:
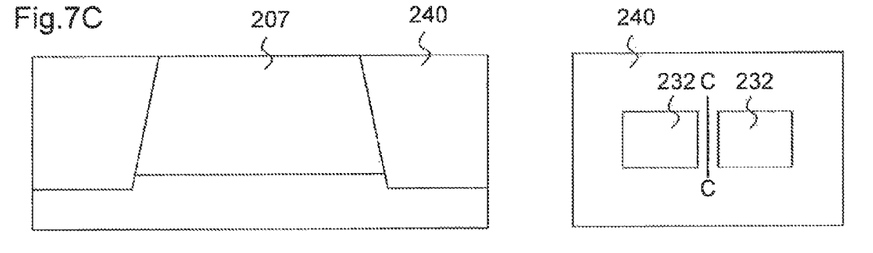
Figure 7D:
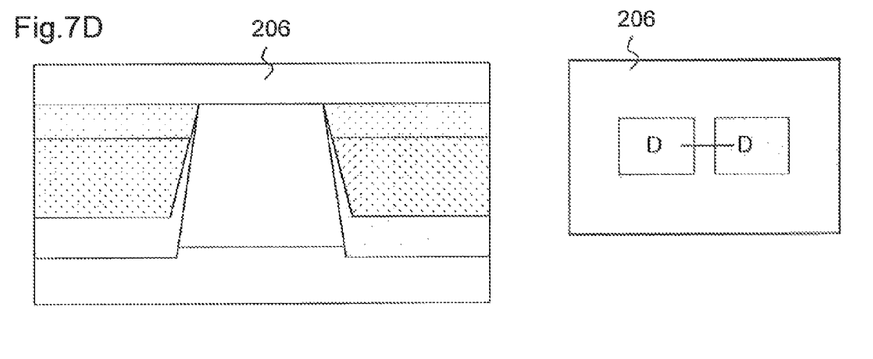

Firstly, as illustrated in FIG. 7A, a MR film 207' is formed on a lower shield layer 205, the MR film 207' having the same configuration as that of a MR stack 207. Next, as illustrated in FIG. 7B, the MR film 207' is partially milled, and a track direction width T of the MR stack 207 is formed. At milled portions, which are on the both sides of the MR stack 207 with respect to the track width direction, insulation films 231 are formed, and bias magnetic field application layers 232 are formed. The configuration of the bias magnetic field application layer 232 varies by samples. Thereafter, by lift-off, upper surfaces of the bias magnetic field application layers 232 and the MR film 207' are planarized. Next, as illustrated in FIG. 7C, by Ar ion milling, a height (length in a direction orthogonal to the track width direction T) of the MR stack 207 is formed, and at the same time heights of the bias magnetic field application layers 232 are formed. In a milled portion, an insulation layer 240 is formed, and thereafter, by lift-off, upper surfaces of the insulation layer 240, the bias magnetic field application layers 232, and the MR stack 207 are planarized. Next, as illustrated in FIG. 7D, an upper shield layer 206 is formed on the planarized surface. After finishing the above-described process, high temperature annealing and magnetizing are performed to develop coercive force of the hard magnetic layers (regularize the hard magnetic layers). The high temperature annealing was performed for three hours at 250° C. under zero magnetic field. The magnetizing was performed at a temperature of 200° C. under 15 kOe of a magnetic field applied in the track width direction. Film configurations of the four types of the bias magnetic field application layers and coercive force Hc thereof are indicated in Table 3.

TABLE 3

| Sample | [1] Insulation Film | [2] Pt Seed Layer | [3] Magnetic Layer | [4] Pt Cap Layer | [5] Cap Layer | Total Pt Content Percentage (at %) in layers [2]-[4] | Hc (kOe) |
|---|---|---|---|---|---|---|---|
| A | Al$_2$O$_3$ 8 nm | N/A | FePt 20 nm | Pt 2 nm | Ru 2 nm | 35 | 2.4 |
| B | Al$_2$O$_3$ 8 nm | N/A | FePt 20 nm | Pt 2 nm | Ru 2 nm | 45 | 4.4 |
| C | Al$_2$O$_3$ 8 nm | Pt 2 nm | FePt 20 nm | Pt 2 nm | Ru 2 nm | 35 | 4.5 |
| D | MgO 8 nm | Pt 2 nm | FePt 20 nm | Pt 2 nm | Ru 2 nm | 35 | 4.5 |

The Hc of the sample A is lower than those of the other samples. The sample B has the same film configuration as the sample A; however, the sample B has a higher Pt content percentage of the hard magnetic layer (FePt layer), so that higher Hc is developed. The sample C has a total Pt content percentage the same as the sample A; however, higher Hc is obtained by providing the Pt seed layer. The sample D is different from the sample C in point of using MgO for the insulation film; however, the samples B and C have similar values of Hc.

For each of the samples A-D, 900 pieces or more of reader elements were formed. An element resistance value, an output value, a noise occurrence percentage (ratio of noise occurrence), and a magnetization reversal percentage (ratio of magnetic reversal) (tolerance with respect to an external magnetic field) of the bias magnetic field application layers, of the reader elements were evaluated. Evaluation results are indicated in Table 4.

TABLE 4

| Sample | Element Resistance Average Value (ohm) | Output Average Value (mV) | Noise Occurrence Percentage (%) | Magnetization Reversal Percentage (%) |
|---|---|---|---|---|
| A | 604 | 24.2 | 4.2 | 17.0 |
| B | 617 | 29.7 | 21.2 | 2.4 |
| C | 495 | 19.7 | 4.5 | 1.9 |
| D | 600 | 23.9 | 3.7 | 2.0 |

In order to obtain the noise occurrence percentage, while magnetic field sweeping was performed at ±400 Oe, noise pulse was measured, and the number of noise pulses that had a height of 30% or more of the output value were counted. The noise occurrence percentage was calculated as a ratio of reader elements whose number of pulses exceeds 500 times. It is thought that the noise pulse is caused by magnetic domain discontinuous movement of the magnetization free layer. Therefore, it was judged that, in a sample with small number times of noise pulses, magnetic domain discontinuous movement of the magnetization free layer is small, in other words, an intensity of a bias magnetic field to be applied to the magnetization free layer is large.

In order to obtain the magnetization reversal percentage, a high magnetic field at 3 kOe was applied in a direction orthogonal to a magnetizing direction of the bias magnetic field application layer. The magnetization reversal percentage was calculated as a ratio of reader elements whose output value has varied by ±25% or more after the application of the high magnetic field. Samples whose output values of the reader elements have significantly varied were judged as reader elements with the bias magnetic field application layer (hard magnetic layer) whose magnetization has reversed.

The sample A has a low external magnetic field tolerance because the Hc of the bias magnetic field application layer is low. Therefore, magnetization reversal in the bias magnetic field application layer is more likely to occur, and a contact tolerance with the recording medium may decrease. In the sample B, while an external magnetic field tolerance has been improved due to high Hc, the noise occurrence percentage has increased. It is thought that this is because, due to the high Pt content percentage (low Fe content percentage), an intensity of an effective magnetic field applied from the bias magnetic field application layer to the magnetization free layer is decreased thereby magnetic domain discontinuous movement of the magnetization free layer is more likely to occur.

Figure 8A:
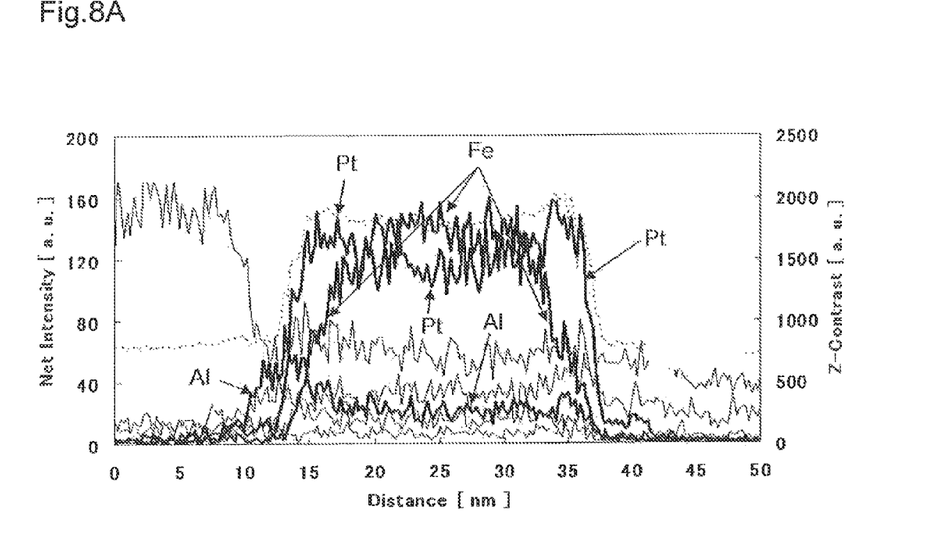
FIGS. 8A and 8B are energy dispersive X-ray (EDS) analysis results of the example (sample C) before and after annealing.
Figure 8B:
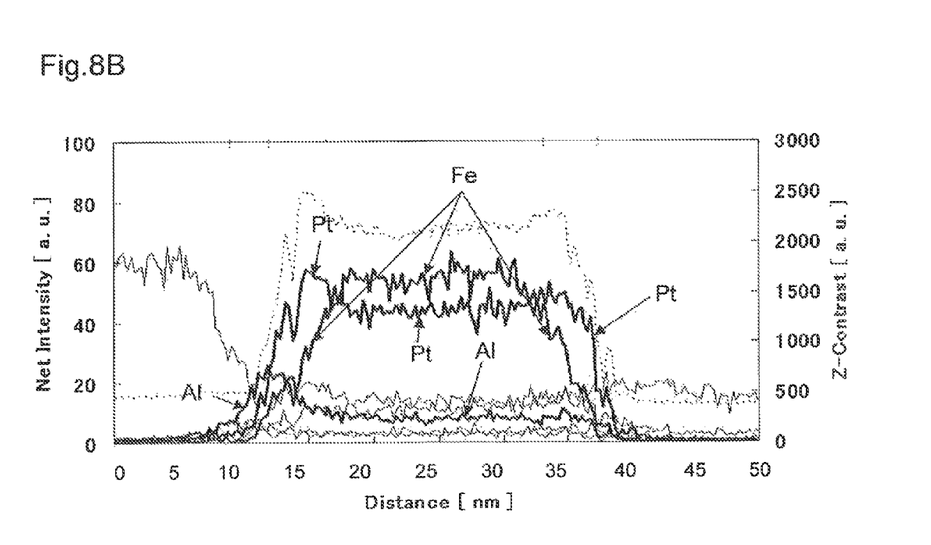

Because the sample C in which the Pt seed layer is used has realized high Hc with a low Pt content percentage, both the noise occurrence percentage and the magnetization reversal percentage can be suppressed low. However, in the sample C, both the element resistance value and the output value are decreased. In order to analyze a reason therefor, an energy-dispersive x-ray spectroscopy (EDS) analysis was performed of the bias magnetic field application layers before and after annealing. FIG. 8A indicates an EDS analysis result of the layer before annealing, and FIG. 8B indicates an EDS analysis result of the layer after annealing. It is proven that Pt in the Pt seed layer diffuses into $Al_2O_3$ (in the vicinity of a peak of Al in the drawing) in the insulation film. Therefore, it is thought that the insulativity is decreased and a current path (bypass path for a sense current) in parallel to the MR stack is formed. Therefore, in the case of using the Pt seed layer, it is desired to prevent Pt from diffusing into the insulation film by annealing.

In the sample D in which MgO instead of $Al_2O_3$ is used for the insulation film, both the noise occurrence percentage and the magnetization reversal percentage can be suppressed low without causing the decrease in the output value. Also in a case where a diffusion prevention layer made of such as for example Ru is inserted between the insulation film made of $Al_2O_3$ and the Pt seed layer, the same effect can be expected; however, because, in that case, a distance between the hard magnetic layer and the MR stack (especially the magnetization free layer) becomes large, it is anticipated that an effective magnetic field is decreased and the noise occurrence percentage is increased. Therefore, in the case of using the Pt seed layer, it is effective to use a MgO insulation film as the sample D.

Next, with the film configuration of the sample D, while an atomic fraction (Pt content percentage) of platinum of the region formed by combining the hard magnetic layer, the Pt seed layer and the Pt cap layer was varied by every 4% in the range of 26-46 at %, the same experiment was performed. Results indicated in Table 5 were obtained.

TABLE 5

| Sample | Total Pt Content Percentage (at %) | Element Resistance Average Value (ohm) | Output Average Value (mV) | Noise Occurrence Percentage (%) | Magnetization Reversal Percentage (%) |
|---|---|---|---|---|---|
| D1 | 26 | 623 | 18.7 | 3.2 | 19.2 |
| D2 | 30 | 635 | 19.9 | 4.4 | 8.1 |
| D3 | 34 | 619 | 21.2 | 2.1 | 2.6 |
| D4 | 38 | 617 | 23.9 | 3.7 | 2.0 |
| D5 | 42 | 608 | 24.7 | 3.6 | 1.7 |
| D6 | 46 | 627 | 28.7 | 16.5 | 3.2 |

Figure 9:
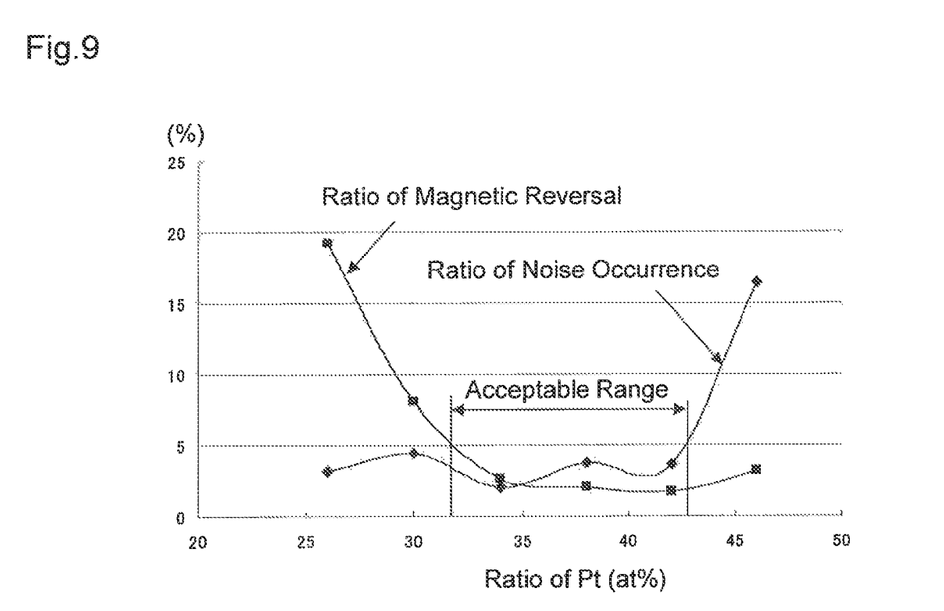
FIG. 9 is a graph indicating the relationship between the noise occurrence percentage (ratio of noise occurrence) and the Pt content percentage (ratio of Pt content), and the relationship between the magnetization reversal percentage (ratio of magnetic reversal) and the Pt content percentage.

Not depending on the Pt content percentages, the element resistance values were almost constant, and a significant variation in the output values was not found. In contrast, the noise occurrence percentage significantly increased when the Pt content percentage was 46%, and the magnetization reversal percentage significantly increased when the Pt content percentage was 26%. FIG. 9 indicates the relationship between the noise occurrence percentage (ratio of noise occurrence) and the Pt content percentage (ratio of Pt content), and the relationship between the magnetization reversal percentage (ratio of magnetic reversal) and the Pt content percentage. A range of the Pt content percentage that suppresses both the noise occurrence percentage and the magnetization reversal percentage to a value (5% or less) with which a significant problem in practice does not occur is between 32% (inclusive) and 43% (inclusive).

Figure 10:
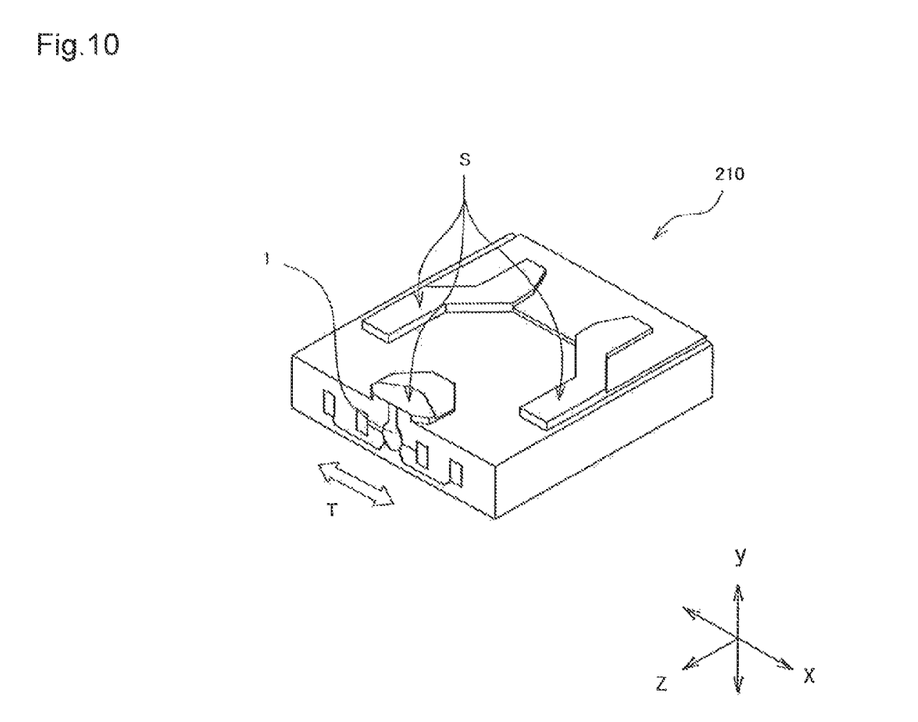
FIG. 10 is a perspective view of a magnetic head slider of the present invention.

Next, the description is given regarding a magnetic head slider on which the thin film magnetic head 1 is mounted. Referring to FIG. 10, a magnetic head slider 210 has a substantially hexahedral shape, and one surface of the six outer surfaces is the air bearing surface S that faces a hard disk. The magnetic head slider 210 is arranged in the hard disk device so as to face the hard disk, which is a disk-shaped recording medium M that is rotatably driven. When the hard disk rotates in the z-direction of FIG. 11, air flow passing between the hard disk and the magnetic head slider 210 generates a downward lifting force in the y-direction to the magnetic head slider 210. The magnetic head slider 210 flies above the surface of the hard disk due to the lifting force. In the vicinity of the edge part of the magnetic head slider 210 (edge part in bottom left of FIG. 10) on the air flow exit side, the thin film magnetic head 1 is formed.

Figure 11:
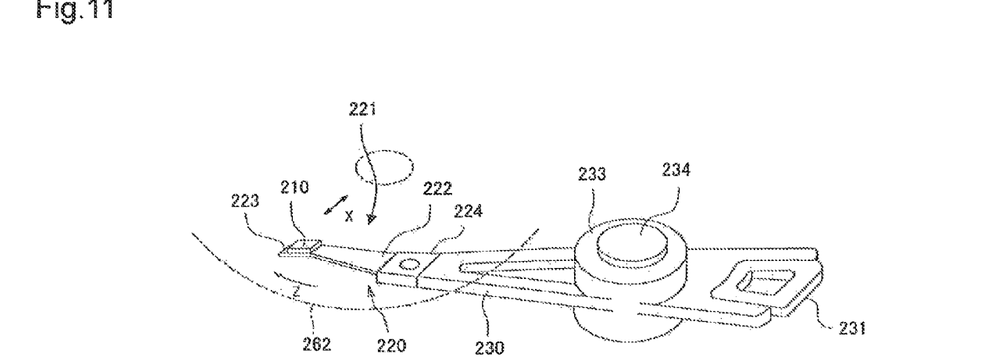
FIG. 11 is a perspective view of a head arm assembly of the present invention.

Referring to FIG. 11, a head gimbal assembly 220 includes the magnetic head slider 210 and a suspension 221 elastically supporting the magnetic head slider 210. The suspension 221 includes a load beam 222, a flexure 223 and a base plate 224. The load beam 222 is formed of stainless steel in a plate spring shape. The flexure 223 is arranged in one edge part of the load beam 222. The base plate 224 is arranged in the other edge part of the load beam 222. The magnetic head slider 210 is joined to the flexure 223 to give the magnetic head slider 210 suitable flexibility. At the part of the flexure 223 to which the magnetic head slider 210 is attached, a gimbal part is disposed to maintain the magnetic head slider 210 in an appropriate orientation.

An assembly in which the head gimbal assembly 220 is mounted to an arm 230 is referred to as a head arm assembly 221. The arm 230 moves the magnetic head slider 210 in a track crossing direction x of a hard disk 262. One edge of the arm 230 is attached to the base plate 224. To the other edge of the arm 230, a coil 231 that forms one part of a voice coil motor is attached. A bearing part 233 is disposed in the middle part of the arm 230. The arm 230 is rotatably supported by a shaft 234 attached to the bearing part 233. The arm 230 and the voice coil motor for driving the arm 230 configure an actuator.

Figure 12:
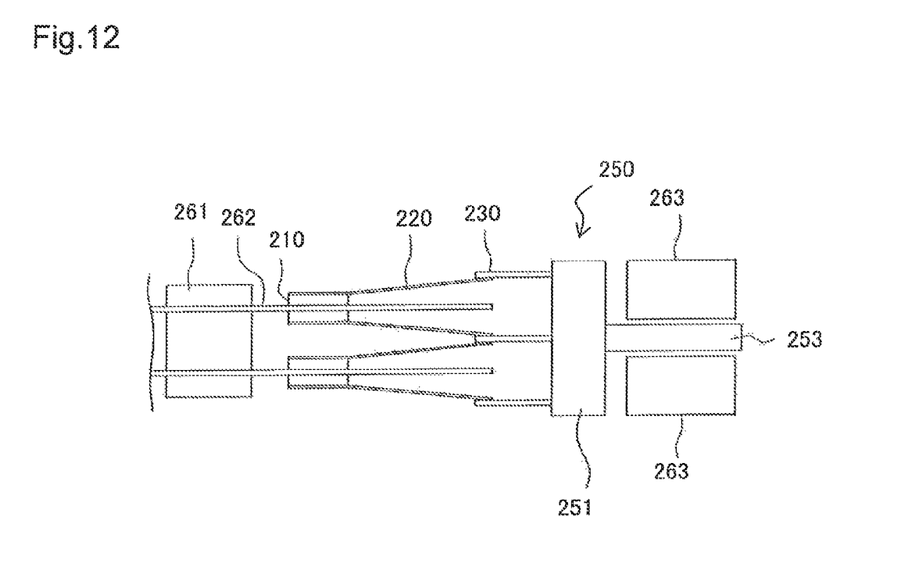
FIG. 12 is a side view of a head stack assembly of the present invention.
Figure 13:
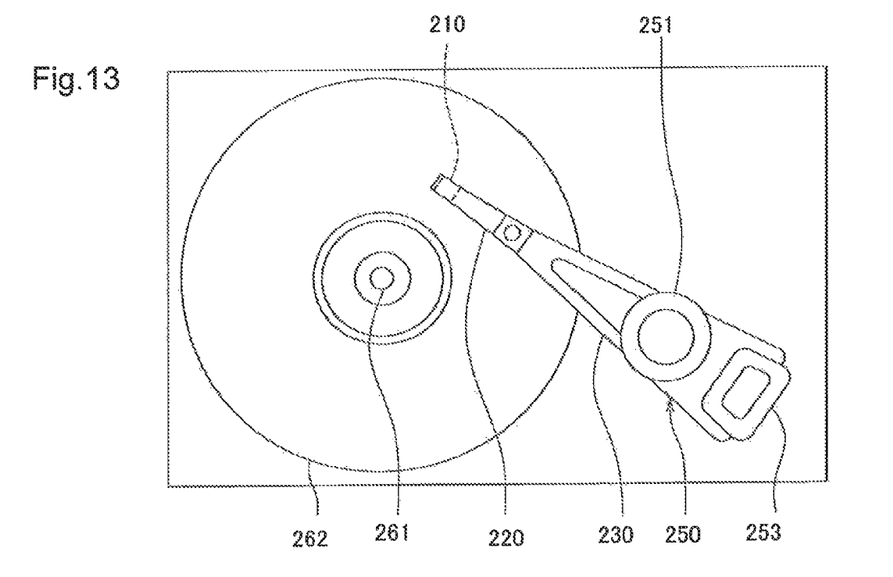
FIG. 13 is a plan view of a hard disk device of the present invention.

Next, referring to FIGS. 12 and 13, the description is given with regard to a head stack assembly in which the above-described magnetic head slider is integrated, and the hard disk device. The head stack assembly is an assembly in which the head gimbal assembly 220 is attached to each arm of a carriage including a plurality of the arms. FIG. 12 is a side view of the head stack assembly, and FIG. 13 is a plan view of the hard disk device. The head stack assembly 250 includes a carriage 251 including a plurality of arms 230. On each of the arms 230, the head gimbal assembly 220 is attached such that the head gimbal assemblies 220 align mutually at an interval in the vertical direction. On the side of the carriage 251, which is the opposite side to the arm 230, a coil 253 is mounted to be a part of the voice coil motor. The voice coil motor includes permanent magnets 263 arranged so as to sandwich the coil 253 and to face each other.

Referring to FIG. 13, the head stack assembly 250 is integrated in the hard disk device. The hard disk device includes multiple hard disks 262 attached to a spindle motor 261. For each of the hard disks 262, two magnetic head sliders 210 are arranged in a manner of sandwiching the hard disk 262 and facing each other. The head stack assembly 250 except for the magnetic head slider 210 and the actuator position the magnetic head slider 210 with respect to the hard disk 262 in correspondence with a positioning device as well as supports the magnetic head slider 210. The magnetic head slider 210 is moved in the track crossing direction of the hard disk 262 by the actuator, and is positioned with respect to the hard disk 262. The thin film magnetic head 11 included in the magnetic head slider 210 records information to the hard disk 262 with the recording element 3, and reproduces information recorded on the hard disk 262 with the reader elements 2 and 102.

While preferred embodiments of the present invention have been shown and described in detail, and it is to be understood that variety of changes and modifications may be made without departing from the spirit of scope of the following claims or its scope.

What is claimed is:

1. A magneto-resistive effect (MR) element, comprising:
   a magneto-resistive (MR) stack that is provided with a magnetization free layer of which a magnetization direction changes according to an external magnetic field and that detects a change of the external magnetic field as an electrical resistance change based on a MR effect;
   a bias magnetic field application layer that is positioned on a side of the MR stack, which excludes an air bearing surface, with respect to a lamination direction;
   a lower shield layer that is positioned on a lower side of the MR stack and the bias magnetic field application layer with respect to the lamination direction; and
   an insulation film that insulates the bias magnetic field application layer from the MR stack and the lower shield layer, wherein
   the bias magnetic field application layer includes:
      a hard magnetic layer that is positioned on a side of the magnetization free layer with respect to the lamination direction, and that is formed of an iron-platinum (FePt) alloy; and
      a Pt seed layer that is provided between the MR stack and the hard magnetic layer and between the lower shield layer and the hard magnetic layer in a contact manner with the hard magnetic layer, and that is formed of platinum (Pt), and
   the insulation film is a MgO insulation film that is formed of oxide magnesium (MgO), that is provided between the MR stack and the Pt seed layer and between the lower shield layer and the PT seed layer in a contact manner with the Pt seed layer.

2. The MR element according to claim 1, further comprising:
   a Pt cap layer that is provided on an upper surface of the hard magnetic layer with respect to the lamination direction in a contact manner with the hard magnetic layer, and that is formed of platinum (Pt).

3. The MR element according to claim 2, wherein
   an atomic fraction of platinum (Pt) of a region formed by combining the hard magnetic layer, the Pt seed layer and the Pt cap layer is between 32% (inclusive) and 43% (inclusive).

4. The MR element according to claim 2, further comprising:
   an upper cap layer that is provided on an upper surface of the Pt cap layer with respect to the lamination direction in a contact manner with the Pt cap layer, and that is formed of one or more of ruthenium (Ru), rhodium (Rh), palladium (Pd), osmium (Os), and iridium (Ir).

5. The MR element according to claim 2, further comprising:
   one or more other hard magnetic layers formed of the iron-platinum (FePt) alloy; and
   one or more other Pt cap layers formed of platinum (Pt),
   wherein the other Pt cap layers are formed by the same number as the other hard magnetic layers,
   wherein the other hard magnetic layers and the other Pt cap layers are alternatively formed on an upper surface of the Pt cap layer with respect to the lamination direction such that one of the other hard magnetic layers is provided on the upper surface of the Pt cap layer in a contacting manner.

6. The MR element according to claim 1, wherein
   a film thickness of the MgO insulation film is between 1 nm (inclusive) and 10 nm (inclusive).

7. The MR element according to claim 1, wherein
   a film thickness of the Pt seed layer is between 0.5 nm (inclusive) and 5 nm (inclusive).

8. The MR element according to claim 2, wherein
   a film thickness of the Pt cap layer is between 0.5 nm (inclusive) and 10 nm (inclusive).

9. A magnetic head slider, comprising;
   a substrate; and
   the MR element according to claim 1 that is formed on the substrate.

10. A head gimbal assembly, comprising:
    a magnetic head slider according to claim 9; and
    a suspension that elastically supports the magnetic head slider, wherein
    the suspension includes:
       a flexure to which the magnetic head slider is joined;
       a load beam whose one end is connected with the flexure; and
       a base plate that is connected with another end of the load beam.

11. A hard disk device, comprising:
    the magnetic head slider according to claim 9;
    a recording medium that is positioned facing the magnetic head slider;
    a spindle motor that rotationally drives the recording medium; and
    a positioning device that supports the magnetic head slider and that positions the magnetic head slider with respect to the recording medium.

12. A magneto-resistive effect (MR) element, comprising:
    a magneto-resistive (MR) stack that is provided with a magnetization free layer of which a magnetization direction changes according to an external magnetic field and that detects a change of the external magnetic field as an electrical resistance change based on a MR effect; and
    a bias magnetic field application layer that is positioned on a side of the MR stack, which excludes an air bearing surface, with respect to a lamination direction, wherein
    the bias magnetic field application layer includes:
       a hard magnetic layer that is positioned on a side of the magnetization free layer with respect to the lamination direction, and that is formed of an iron-platinum (FePt) alloy;

a Pt seed layer that is provided between the MR stack and the hard magnetic layer and on a lower surface of the hard magnetic layer with respect to the lamination direction, and in a contact manner with the hard magnetic layer, and that is formed of platinum (Pt); and a Pt cap layer that is provided on an upper surface of the hard magnetic layer with respect to the lamination direction and in a contact manner with the hard magnetic layer and that is formed of platinum (Pt), and an atomic fraction of platinum (Pt) of a region formed by combining the hard magnetic layer, the Pt seed layer and the Pt cap layer is between 32% (inclusive) and 43% (inclusive).

\* \* \* \* \*